(12) United States Patent
Cheng et al.

(10) Patent No.: US 7,919,409 B2
(45) Date of Patent: Apr. 5, 2011

(54) MATERIALS FOR ADHESION ENHANCEMENT OF COPPER FILM ON DIFFUSION BARRIERS

(75) Inventors: Hansong Cheng, Allentown, PA (US); Xinjian Lei, Vista, CA (US); Daniel P. Spence, San Diego, CA (US); John Anthony Thomas Norman, Encinitas, CA (US); David Allen Roberts, Fogelsville, PA (US); Bo Han, Wuhan (CN); Chenggang Zhou, Wuhan (CN); Jinping Wu, Wuhan (CN)

(73) Assignee: Air Products and Chemicals, Inc., Allentown, PA (US)

( * ) Notice: Subject to any disclaimer, the term of this patent is extended or adjusted under 35 U.S.C. 154(b) by 132 days.

(21) Appl. No.: 12/192,603

(22) Filed: Aug. 15, 2008

(65) Prior Publication Data

US 2010/0038785 A1    Feb. 18, 2010

(51) Int. Cl.
*H01L 21/285* (2006.01)
(52) U.S. Cl. .................. 438/653; 257/E21.168
(58) Field of Classification Search .................. 257/751, 257/E21.168; 438/653
See application file for complete search history.

(56) References Cited

U.S. PATENT DOCUMENTS

| | | |
|---|---|---|
| 5,668,054 A | 9/1997 | Sun et al. |
| 5,942,799 A | 8/1999 | Danek et al. |
| 6,140,231 A | 10/2000 | Lin et al. |
| 6,153,519 A | 11/2000 | Jain et al. |
| 6,194,310 B1 | 2/2001 | Hsu et al. |
| 6,271,131 B1 | 8/2001 | Uhlenbrock et al. |
| 6,287,965 B1 | 9/2001 | Kang et al. |
| 6,331,484 B1 | 12/2001 | Bhowmilk et al. |
| 6,627,542 B1 | 9/2003 | Gandikota et al. |
| 6,989,321 B2 | 1/2006 | Yamasaki et al. |
| 7,034,169 B1* | 4/2006 | Norman ............... 556/10 |
| 7,205,422 B2* | 4/2007 | Norman ............... 556/32 |
| 7,220,671 B2 | 5/2007 | Simka et al. |
| 7,223,695 B2 | 5/2007 | Zhong et al. |
| 2002/0045343 A1 | 4/2002 | McElwee-White et al. |
| 2003/0059980 A1 | 3/2003 | Chen et al. |

(Continued)

FOREIGN PATENT DOCUMENTS

FR    2883287    9/2006

(Continued)

OTHER PUBLICATIONS

Petra Alen et al, Atomic Layer Deposition of Molybdenum Nitride Thin Films for Cu Metallizations, Journal of The Electrochemical Society, 2005, G361-G366, 152(5).

(Continued)

*Primary Examiner* — Matthew S Smith
*Assistant Examiner* — Daniel Shook
(74) *Attorney, Agent, or Firm* — Lina Yang

(57) ABSTRACT

We have used the state-of-the-art computational chemistry techniques to identify adhesion promoting layer materials that provide good adhesion of copper seed layer to the adhesion promoting layer and the adhesion promoting layer to the barrier layer. We have identified factors responsible for providing good adhesion of copper layer on various metallic surfaces and circumstances under which agglomeration of copper film occur. Several promising adhesion promoting layer materials based on chromium alloys have been predicted to be able to significantly enhance the adhesion of copper films. Chromium containing complexes of a polydentate β-ketoiminate have been identified as chromium containing precursors to make the alloys with chromium.

11 Claims, 10 Drawing Sheets

U.S. PATENT DOCUMENTS

| | | |
|---|---|---|
| 2005/0051512 A1 | 3/2005 | Lin |
| 2005/0070097 A1 | 3/2005 | Barmak et al. |
| 2005/0167837 A1 | 8/2005 | Cheng et al. |
| 2005/0274621 A1 | 12/2005 | Sun et al. |
| 2007/0123043 A1 | 5/2007 | Streck et al. |
| 2007/0184578 A1* | 8/2007 | Lin et al. .......... 438/106 |
| 2007/0264816 A1 | 11/2007 | Lavoie et al. |
| 2010/0018439 A1* | 1/2010 | Cameron et al. ....... 106/287.19 |

FOREIGN PATENT DOCUMENTS

| | | |
|---|---|---|
| KR | 2006001306 | 1/2006 |
| WO | 0129893 | 4/2001 |
| WO | 2006115476 | 11/2006 |

OTHER PUBLICATIONS

Junghun Chae et al, Atomic Layer Deposition of Nickel by the Reduction of Preformed Nickel Oxide, Electrochemical and Solid-State Letters, 2002, C64-C66, 5(6).

Alain E. Kaloyeros et al, Tantalum Nitride Films Grown by Inorganic Low Temperature Thermal Chemical Vapor Deposition, Journal of The Electrochemical Society, 1999, 170-176, 146(1).

Jean E. Kelsey et al, Low Temperature metal-organic chemical vapor deposition of tungsten nitride as diffusion barrier for copper metallization, J. Vac. Sci. Technol., 1999, 1101-1104, 17(3).

Soo-Hyun Kim et al, A Comparative Study of Film Properties of Chemical Vapor Deposited TiN Films as Diffusion Barriers for Cu Metallization, Journal of The Electrochemical Society, 1999, 1455-1460, 146(4).

Zhengwen Li et al, Nucleation and Adhesion of ALD Copper on Cobalt Adhesion Layers and Tungsten Nitride Diffusion Barriers, Electrochemical and Solid-State Letters, 2005, G182-G185, 8(7).

F. Maury et al, Evaluation of tetra-alkylchromium precursors for organometallic chemical vapor deposition II. Unusual low temperature chromium carbide deposition from $Cr[C(CH3)3]4$, Thin Solid Films, 1992, 24-29, 219.

Franco Ossola et al, MOCVD Route to Chromium Carbonitride Thin Films Using $Cr(NEt2)4$ as Single-Source Precursor: Growth and Mechanism, Chemical Vapor Deposition, 1997, 137-143, 3.

Francis Maury et al, Low-Temperature MOCVD of Chromium Carbonitride Coatings from Tetrakis (diethylamido) chromium and Pyrolysis Mechanism of this Single-Source Precursor, Applied Organometallic Chemistry, 1998, 189-199, 12.

Renaud Fix et al, Chemical Vapor Deposition of Vanadium, Niobium, and Tantalum Nitride Thin Films, Chem. Mater., 1993, 614-619, 5.

Ville Miikkulainen et al, Atomic Layer Deposition of Molybdenum Nitride from Bis(tert-butylimido)-bis (dimethylamido)molybdenum and Ammonia onto Several Types of Substrate Materials with Equal Growth per Cycle, Chem. Mater., 2007, 263-269, 19.

* cited by examiner (a)

(b)

(a)          (b)

MATERIALS FOR ADHESION ENHANCEMENT OF COPPER FILM ON DIFFUSION BARRIERS

BACKGROUND OF THE INVENTION

In the fabrication of semiconductor devices, increased density and speed has caused a shift in the metallization system from aluminum (Al) to copper (Cu) to reduce the resistance of the conductor. To reduce the capacitive coupling between adjacent metal lines, materials having low k dielectric constant are used to form dielectric layers between adjacent metal lines. Furthermore, to prevent diffusion of copper containing materials into the surrounding low k dielectric layers, diffusion barrier layers are incorporated between metal layers and dielectric layers.

However, due to reliability issues of electromigration resistance and void formation, adhesion between copper and the diffusion barrier layer is a major concern. With typical copper diffusion barrier layers now available, copper has less than desirable adhesion to the barrier layers and has a tendency to agglomerate for future technology nodes such as 22 nm and beyond future size.

U.S. Pat. No. 6,271,131 discloses a method of forming a rhodium (Rh) containing layer such as platinum-rhodium (Pt—Rh) alloy as diffusion barrier via chemical vapor deposition. However Pt and Rh are very expensive noble metals which makes it impossible to adopt in the semi-conductor industries.

U.S. Pat. No. 1,063,687 describes a titanium-tantalum (Ti—Ta) barrier layer film for use in conjunction with an interconnect film such as Cu. The Ti rich/Ta deficient portion provides good adhesion to the dielectric film and the Ta rich/Ti deficient portion forms a hetero-epitaxial interface with the interconnect film and suppresses the formation of inter-metallic compounds.

U.S. Pat. No. 5,942,799 discloses a multilayer diffusion barrier comprising a refractory metal such as tungsten (W), titanium (Ti), tantalum (Ta), molybdenum (Mo); and a refractory metal nitride such as WNx, TiN, TaN; and a second sublayer formed from a refractory metal nitride, a refractory metal silicon nitride such as TiSixNy, TaSixNy, WSixNy.

US 20050070097 discloses a very thin multilayer diffusion barrier for a semiconductor device and fabrication method thereof. The multilayer diffusion barrier is fabricated by forming a very thin, multilayer diffusion barrier composed of even thinner sub-layers, where the sub-layers are only a few atoms thick.

US 2006001306 reveals a method to enhance thermal stability and reliability by forming a hybrid type nanocomposite diffusion barrier deposited by atomic layer deposition using precursors composing of a Ti precursor and a Ta precursor.

US 2006115476 covers the ruthenium alloy as copper diffusion barrier comprising of ruthenium and at least one element from groups IV, V, or VI of the Periodic Table or a combination thereof.

US20070264816A1 discloses a method for forming a metal interconnect to use a Cu—Al alloy layer on the barrier layer. The Cu—Al alloy layer may be formed by sequential ALD or CVD deposition of an aluminum layer and a copper layer followed by an annealing process. Alternately, the Cu—Al alloy layer may be formed in-situ by co-pulsing the aluminum and copper precursors.

US 20070123043 describes a tin and nickel-containing copper alloy as diffusion barrier in a copper interconnect. The tin and nickel-containing copper alloy may be formed in a gaseous ambient on the basis of tin hydride and nickel, carbon monoxide in a thermally driven reaction.

Maury, F. and F. Ossola (1992). "Evaluation of Tetra-Alkylchromium Precursors for Organometallic Chemical Vapor-Deposition. 2. Unusual Low-Temperature Chromium Carbide Deposition from Cr[C(CH3)3]4." Thin Solid Films 219 (1-2): 24-29

Ossola, F. and F. Maury (1997). "MOCVD route to chromium carbonitride thin films using Cr(NEt2)(4) as single-source precursor: Growth and mechanism." Chemical Vapor Deposition 3(3): 137-143.

Accordingly, there remains a need for an improved adhesion process, or metallization process, which controls the agglomeration of copper, and improves the adhesion between barrier layers and subsequently deposited metal layers. There is also a need for an adhesion-promoting materials, or glue layer materials, which promote adhesion between barrier layers and subsequently deposited metal layers.

BRIEF SUMMARY OF THE INVENTION

In the present invention, the state-of-the-art computational chemistry techniques have been used to identify adhesion promoting layer materials that provide good adhesion of metal seed layer to the adhesion promoting layer and the adhesion promoting layer to the barrier layer. Methods of controlling agglomeration and improving adhesion, a semiconductor device structure having controlled agglomeration and improving adhesion, and a chromium precursor for making chromium alloys as the adhesion promoting layer material have also been disclosed.

According to one of the embodiment, a method for controlling agglomeration and improving adhesion of a semiconductor device comprises:
 (1) providing a substrate comprising at least one patterned dielectric layer and at least one barrier layer;
 (2) depositing an adhesion promoting layer comprising a chromium alloy on the at least one barrier layer; and
 (3) depositing a metal seed layer on the adhesion promoting layer;
   wherein adhesion energy between the adhesion promoting layer and the barrier layer is higher than adhesion energy between the adhesion promoting layer and the metal seed layer.

According to another embodiment, a method for controlling agglomeration of a copper layer and improving adhesion between a copper layer and a barrier layer comprises:
 (1) providing a substrate comprising the at least one barrier layer on the top of at least one patterned dielectric layer;
 (2) depositing an adhesion promoting layer comprising a chromium alloy on the at least one barrier layer, and
 (3) depositing the copper layer on the adhesion promoting layer;
   wherein adhesion energy between the adhesion promoting layer and the barrier layer is higher than adhesion energy between the adhesion promoting layer and the copper layer.

According to yet another embodiment, a semiconductor device structure comprises:
 (1) at least one patterned dielectric layer and at least one barrier layer covering the at least one patterned dielectric layer;
 (2) an adhesion promoting layer deposited on the at least one barrier layer, said adhesion promoting layer consisting essentially of a chromium alloy; and
 (3) a conductive metal seed layer covering the adhesion promoting layer.

According to yet another embodiment, a chromium containing complex of a polydentate β-ketoiminate is selected from the group consisting of structure A, Structure A

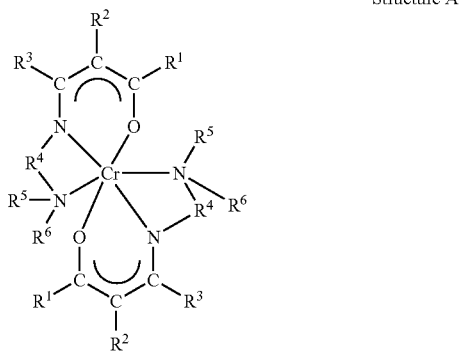

and structure B;

Structure B

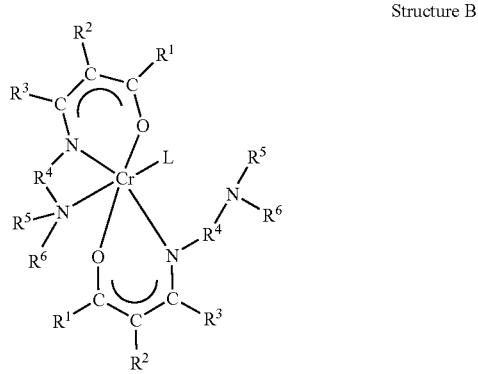

wherein: $R^1$ is a branched bulky alkyl group containing 1 to 6 carbon atoms; $R^2$ is selected from the group consisting of hydrogen, alkyl having from 1 to 6 carbon atoms, alkoxy having from 1 to 6 carbon atoms, cycloaliphatic having from 3 to 6 carbon atoms, and aryl having from 6 to 10 carbon atoms; $R^{3-4}$ are linear or branched selected from the group consisting of alkyl having from 1 to 6 carbon atoms, alkoxy having from 1 to 6 carbon atoms, cycloaliphatic having from 3 to 6 carbon atoms, and aryl having from 6 to 10 carbon atoms; $R^{5-6}$ are linear or branched, individually selected from the group consisting of linear alkyl having from 1 to 6 carbon atoms, fluoroalkyl having from 1 to 6 carbon atoms, cycloaliphatic having from 3 to 10 carbon atoms, aryl having from 6 to 10 carbon atoms, and heterocyclic containing either oxygen, or nitrogen atoms; L is monodentate donor ligand.

DETAILED DESCRIPTION OF THE INVENTION

Figure 1:
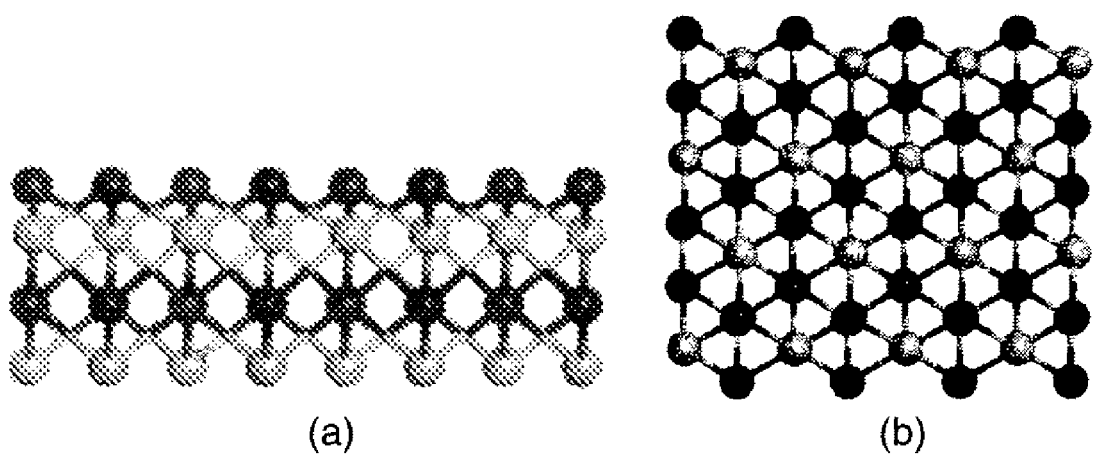
FIG. 1 Structure of tantalum-nitride TaN(111) surface: (a) side view; (b) top view.

Copper adhesion to barrier layers and electromigration resistance are extremely important properties affecting device yield and device lifetimes.

In the present invention, the state-of-the-art computational chemistry techniques have been used to identify adhesion promoting layer materials that provide good adhesion of metal seed layer to the adhesion promoting layer and the adhesion promoting layer to the barrier layer.

In accordance with embodiments of the present invention, adhesion promoting layer, or a "glue" layer, is applied directly to a barrier layer to improve the adhesion of the subsequently deposited metal seed layer.

Suitable barrier layers comprise a material selected from the group consisting of: tantalum (Ta), tantalum-nitride (TaN), tantalum-silicon-nitride (TaSiN), titanium (Ti), titanium-nitride (TiN), and mixtures thereof.

Suitable metal seed layer is selected from a copper layer, a copper alloy layer, and combinations thereof.

Several adhesion promoting layer materials based on chromium alloys have been shown to be able to significantly enhance the adhesion of the copper seed layer. The adhesion promoting layer, or a "glue" layer, comprises a chromium alloy having a formulation of $Cr_xM_y$, where M is a group 4 to 12 metal, such as, copper (Cu), silver (Ag), ruthenium (Ru), vanadium (V), tantalum (Ta), titanium (Ti), zirconium (Zr) and niobium (Nb), x is the atomic weight percentage of Cr, y is the atomic weight percentage of M, and x+y=100%.

Suitable chromium alloys including chromium and about 10% to about 90% atomic weight percentage of an alloying element. As examples, the chromium alloys include chromium-copper $(Cr_xCu_y)$, chromium-silver $(Cr_xAg_y)$, chromium-ruthenium $(Cr_xRu_y)$, chromium-vanadium $(Cr_xV_y)$, chromium-tantalum $(Cr_xTa_y)$, chromium-titanium $(Cr_xTi_y)$, chromium-zirconium $(Cr_xZr_y)$ and chromium-niobium $(Cr_xNb_y)$; where x is in the range of 10% to 90%.

Suitable chromium containing precursors for depositing the chromium alloys are chromium containing complexes of a polydentate β-ketoiminate represented by the following structures A and B:

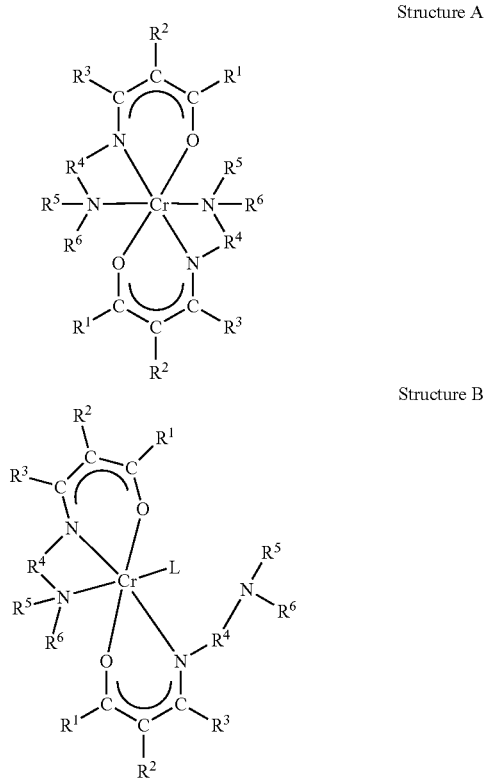

Structure A

Structure B wherein: $R^1$ is a branched bulky alkyl group containing 1 to 6 carbon atoms; $R^2$ is selected from the group consisting of hydrogen, alkyl having from 1 to 6 carbon atoms, alkoxy having from 1 to 6 carbon atoms, cycloaliphatic having from 3 to 6 carbon atoms, and aryl having from 6 to 10 carbon atoms; $R^{3-4}$ are linear or branched selected from the group consisting of alkyl having from 1 to 6 carbon atoms, alkoxy having from 1 to 6 carbon atoms, cycloaliphatic having from 3 to 6 carbon atoms, and aryl having from 6 to 10 carbon atoms; $R^{5-6}$ are linear or branched, individually selected from the group consisting of linear alkyl having from 1 to 6 carbon atoms, fluoroalkyl having from 1 to 6 carbon atoms, cycloaliphatic having from 3 to 10 carbon atoms, aryl having from 6 to 10 carbon atoms, and heterocyclic containing either oxygen, or nitrogen atoms; L is monodentate donor ligand.

Additional objects, advantages, and novel features of this invention will become apparent to those skilled in the art upon examination of the following embodiments thereof, which are not intended to be limiting.

EMBODIMENTS

The TaN(111) surface is described with a slab model containing four alternating layers with Ta (tantalum) and N (nitrogen) with N on top (FIG. 1). The selected unit cell contains 32 Ta and 32 N atoms and the surface cell parameters were fully optimized (a=12.416 Å, b=10.7533 Å, alpha=90°). In between slabs there is an approximately 24 Å vacuum space to prevent effective interaction between slabs. The bottom two layers are kept fixed and the top two layers as well as the Cu adatoms are fully relaxed.

Density functional theory (DFT) calculations under the generalized gradient approximation were performed using the exchange-correlation functional proposed by Perdew-Wang. The PAW pseudopotentials are used to represent the core electrons, while the valence orbitals are described by a plane wave basis set with 400 eV energy cut-off, which is sufficient to produce well-converged results. The electronically open-shell system was treated with a spin polarization scheme. The Brillouin zone integration was performed using the Monkhorst and Pack scheme with 2×2×1 k-points. Calculations with higher k-points (4×4×2) were also performed for dimer formation on the TaN(111) surface and the results were found to be virtually identical to those obtained with 2×2×1 k-points.

All structures were first optimized using the conjugate gradient algorithm and the computational accuracy was tested by calculating the cohesive energy of bulk copper. The calculated cohesive energy is 0.05 eV higher than the experimental value of 3.49 eV, suggesting that the method used in the present study is very accurate.

We subsequently performed ab initio molecular dynamics (MD) simulations for duration of 3.5 ps with a time step of 1 fs at 500 K to study the dynamic behavior of a Cu monolayer on the barrier surface in a canonical ensemble using the Nose thermostat for temperature control. All calculations were carried out using the VASP simulation package.

Ab initio molecular dynamics simulation (MD) was performed on the fully equilibrated TaN(111) surface with a Cu monolayer at 500° K, which is in a typical ALD temperature range.

Figure 2:
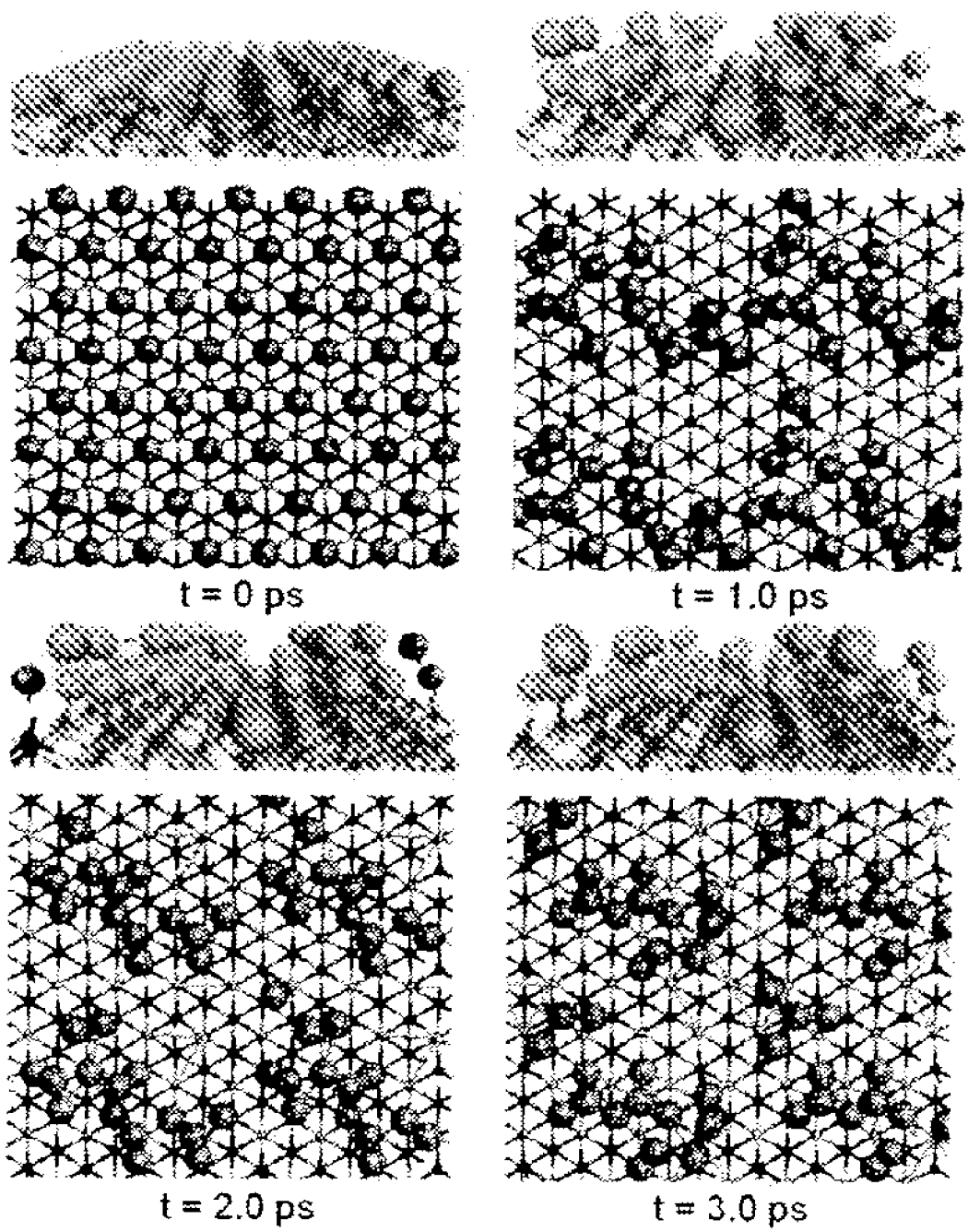
FIG. 2 Snapshot of the MD trajectory.

FIG. 2 displays several selected snapshots of the MD trajectory.

Initially, the Cu monolayer is well aligned and commensurate with the substrate. Cu atoms are then quickly disassembled and move away from their equilibrium positions through surface diffusion upon MD run. At t=1 ps, some of the Cu atoms start moving upward to grow 3-dimensionally. At t=3 ps, the Cu atoms are aggregated together, forming surface islands, and the perfectly ordered monolayer structure becomes significantly disordered. Further MD runs prompt Cu atoms to move continuously, forming surface islands of various shapes, but no wetting of copper clusters on the surface was observed.

The calculated adhesion energy of Cu monolayer on TaN (111) is 2.65 eV.

First Embodiment

Ru (Ruthenium) as an Adhesion Promoting Material

Ab initio molecular dynamics simulation was performed on the fully equilibrated surface with a Cu monolayer on top of a monolayer of Ru commensurate with TaN(111) surface at 500° K.

Figure 3:
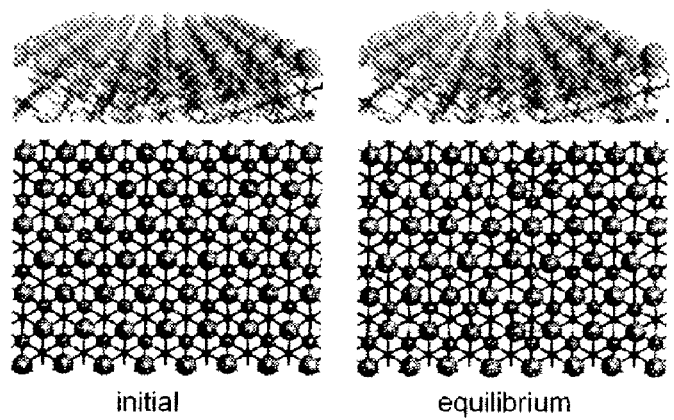
FIG. 3 (a) Copper (Cu) monolayer on top of a ruthenium (Ru) monolayer commensurate to the TaN(111) substrate. (b) initial and equilibrium structures of a Cu monolayer on Ru slab.
Figure 3:
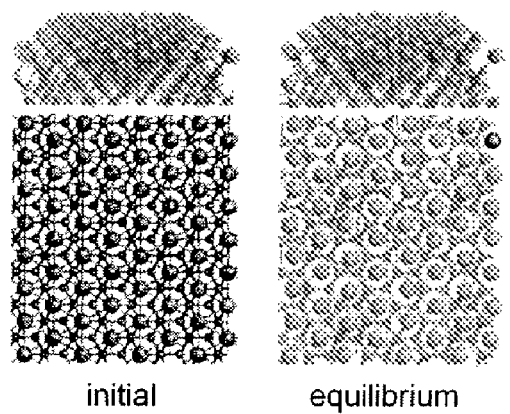

FIG. 3a displays a fully equilibrated structure upon 4 ps MD simulation. No agglomeration of Cu atoms, other than simple thermal motion, was observed. Placing the same monolayer on several layers of Ru, as shown in FIG. 3b, results in no agglomeration of Cu atoms.

The calculated adhesion energy of Cu monolayer on the Ru monolayer is 3.50 eV and the calculated adhesion energy of Ru monolayer on TaN(111) is 5.01 eV, significantly larger than the adhesion energy of Cu monolayer on TaN(111). The results suggest that Cu monolayer will not agglomerate on the Ru adhesion promoting layer.

Second Embodiment

Ta (Tantalum) as an Adhesion Promoting Material

Ab initio molecular dynamics simulation was performed on the fully equilibrated surface with a Cu monolayer on top of a monolayer of Ta commensurate with TaN(111) surface at 500° K.

Figure 4:
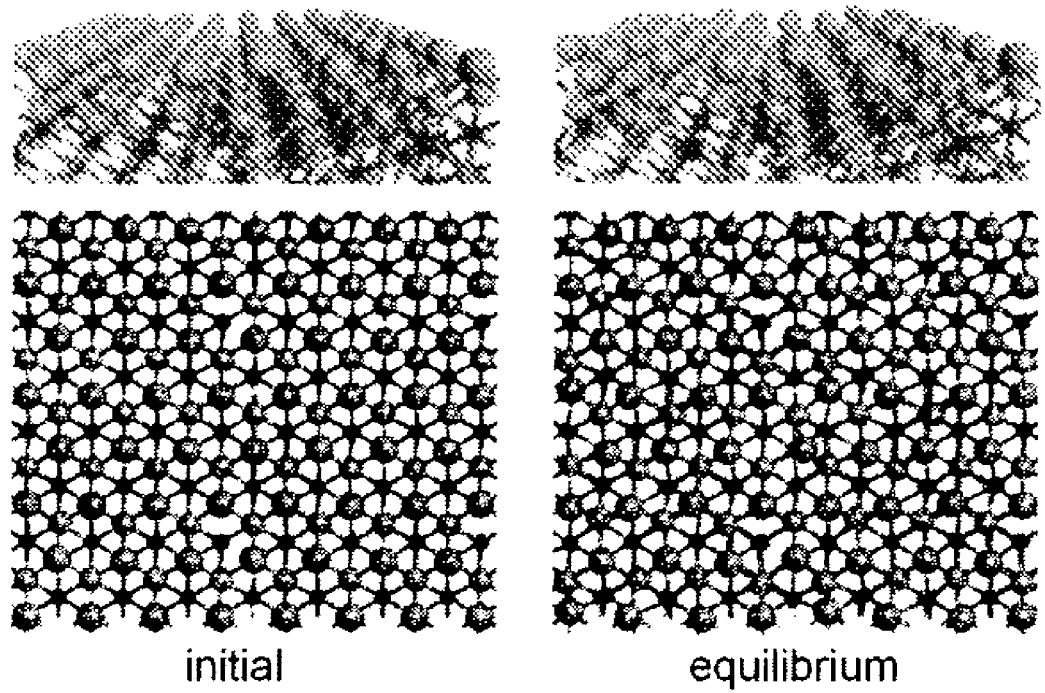
FIG. 4 Cu monolayer on top of a tantalum (Ta) monolayer commensurate to the TaN(111) substrate.

FIG. 4 displays a fully equilibrated structure upon 4 ps MD simulation. No agglomeration of Cu atoms, other than simple thermal motion, was observed. Placing the same monolayer on multi-layers of Ta results in no agglomeration of Cu atoms.

The calculated adhesion energy of Cu monolayer on the Ta monolayer is 3.84 eV and the calculated adhesion energy of Ta monolayer on TaN(111) is 7.72 eV, significantly larger than the adhesion energy of Cu monolayer on TaN(111). The results suggest that Cu monolayer will not agglomerate on the Ta adhesion promoting layer.

Third Embodiment

Cr (Chromium) as an Adhesion Promoting Material

Ab initio molecular dynamics simulation was performed on the fully equilibrated surface with a Cu monolayer on top of a monolayer of Cr commensurate with TaN(111) surface at 500° K.

Figure 5:
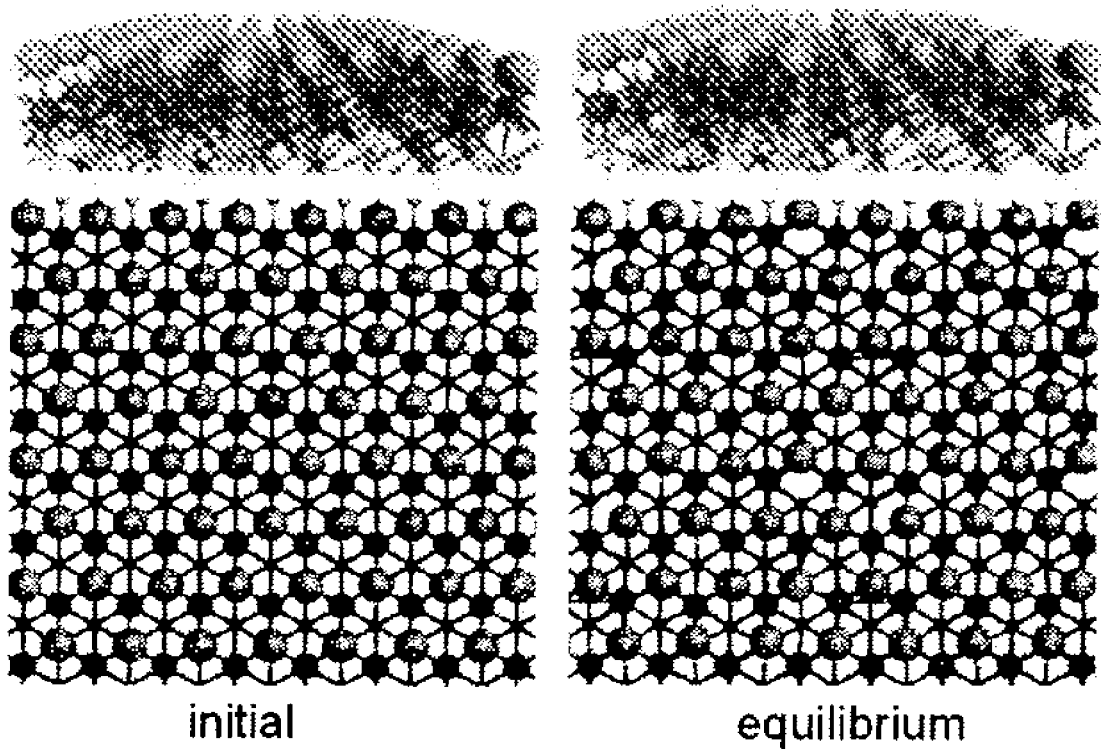
FIG. 5 Cu monolayer on top of a chromium (Cr) monolayer commensurate to the TaN(111) substrate.

FIG. 5 displays a fully equilibrated structure upon 4 ps MD simulation. No agglomeration of Cu atoms, other than simple thermal motion, was observed. Placing the same monolayer on multi-layers of Cr results in no agglomeration of Cu atoms. The calculated adhesion energy of Cu monolayer on the Cr monolayer is 3.52 eV and the calculated adhesion energy of Ta monolayer on TaN(111) is 5.10 eV, significantly larger than the adhesion energy of Cu monolayer on TaN(111). The results suggest that Cu monolayer will not agglomerate on the Cr adhesion promoting layer.

Fourth Embodiment

Cr (Chromium) Binary With V (Vanadium) as an Adhesion Promoting Material

Ab initio molecular dynamics simulation was performed on the fully equilibrated surface with a Cu monolayer on top of a monolayer of $Cr_xV_y$ alloy with x:y=1:1 commensurate with TaN(111) surface at 500° K.

Figure 6:
FIG. 6(a) The equilibrium structure of Chromium binary with Vanadium (CrV) adhesion promoting layer on TaN(111) surface with top view and side view.
FIG. 6(b) The equilibrium structure of Cu monolayer on the CrV adhesion promoting layer on TaN(111) surface with top view and side view.
Figure 6:
Figure 6:
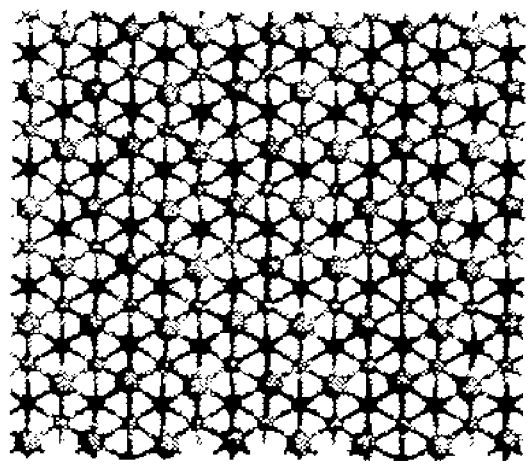
Figure 6:
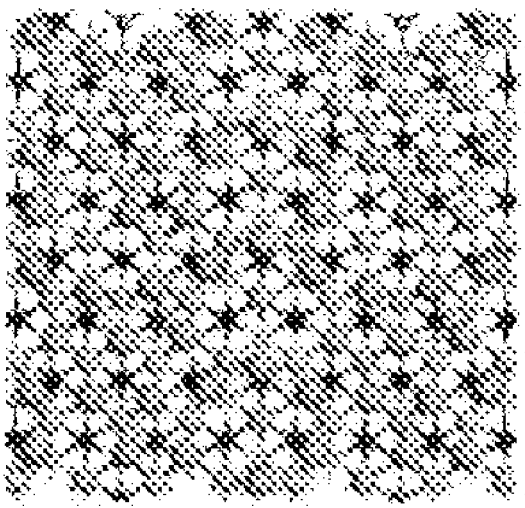

FIG. 6 displays equilibrated structures upon 4 ps MD simulation. FIG. 6(a) displays a fully equilibrium structure of CrV adhesion promoting layer on TaN(111) surface with top view and side view. FIG. 6(b) displays a fully equilibrium structure of Cu monolayer on the CrV adhesion promoting layer on TaN(111) surface with top view and side view.

No agglomeration of Cu atoms, other than simple thermal motion, was observed. The calculated adhesion energy of Cu monolayer on the CrV alloy monolayer is 3.65 eV and the calculated adhesion energy of CrV monolayer on TaN(111) is 5.03 eV, significantly larger than the adhesion energy of Cu monolayer on TaN(111). The results suggest that Cu monolayer will not agglomerate on the CrV adhesion promoting layer.

Fifth Embodiment

Cr (Chromium) Binary With Ti (Titanium) as an Adhesion Promoting Material

Ab initio molecular dynamics simulation was performed on the fully equilibrated surface with a Cu monolayer on top of a monolayer of $Cr_xTi_y$ alloy with x:y=1:1 commensurate with TaN(111) surface at 500° K.

Figure 7:
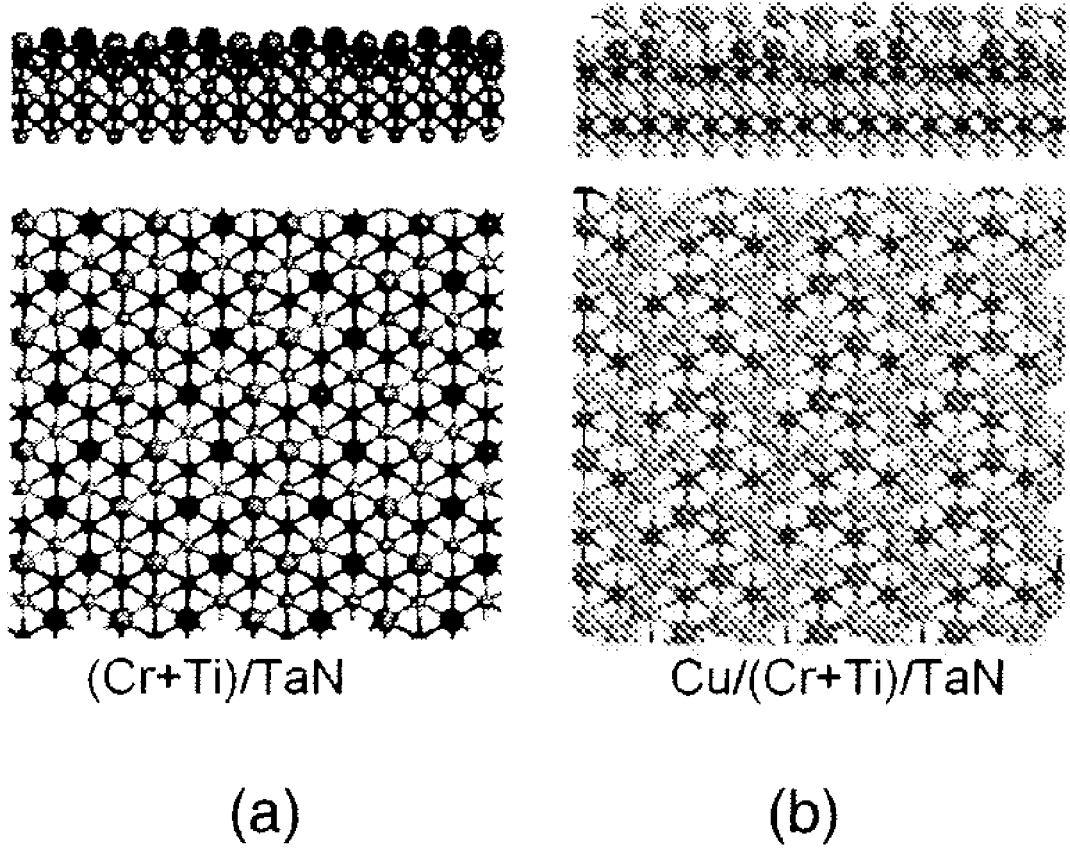
FIG. 7(a) The equilibrium structure of Chromium binary with Titanium (CrTi) adhesion promoting layer on TaN(111) surface with top view and side view.
FIG. 7(b) The equilibrium structure of Cu monolayer on the CrTi adhesion promoting layer on TaN(111) surface with top view and side view.

FIG. 7 displays equilibrated structures upon 4 ps MD simulation. FIG. 7(a) displays the equilibrium structure of CrTi adhesion promoting layer on TaN(111) surface with top view and side view. FIG. 7(b) displays the equilibrium structure of Cu monolayer on the CrTi adhesion promoting layer on TaN (111) surface with top view and side view.

No agglomeration of Cu atoms, other than simple thermal motion, was observed. The calculated adhesion energy of Cu monolayer on the CrTi alloy monolayer is 3.67 eV and the calculated adhesion energy of CrTi monolayer on TaN(111) is 5.51 eV, significantly larger than the adhesion energy of Cu monolayer on TaN(111). The results suggest that Cu monolayer will not agglomerate on the CrTi adhesion promoting layer.

Sixth Embodiment

Cr (Chromium) Binary With Zr (Zirconium) as an Adhesion Promoting Material

Ab initio molecular dynamics simulation was performed on the fully equilibrated surface with a Cu monolayer on top of a monolayer of $Cr_xZr_y$ alloy with x:y=1:1 commensurate with TaN(111) surface at 500° K.

Figure 8:
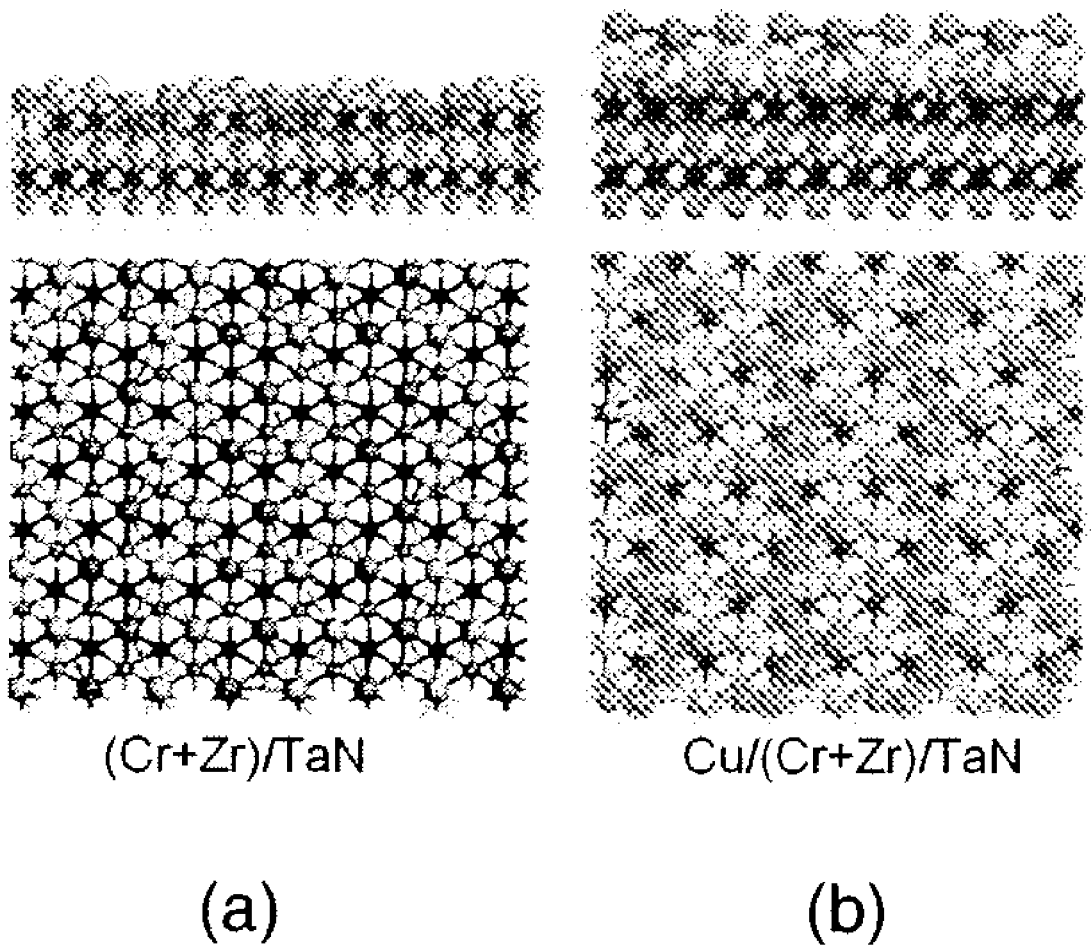
FIG. 8(a) The equilibrium structure of Chromium binary with Zirconium (CrZr) adhesion promoting layer on TaN (111) surface with top view and side view.
FIG. 8(b) The equilibrium structure of Cu monolayer on the CrZr adhesion promoting layer on TaN(111) surface with top view and side view.

FIG. 8 displays equilibrated structures upon 4 ps MD simulation. FIG. 8(a) displays the equilibrium structure of CrZr adhesion promoting layer on TaN(111) surface with top view and side view. FIG. 8(b) displays the equilibrium structure of Cu monolayer on the CrZr adhesion promoting layer on TaN (111) surface with top view and side view.

No agglomeration of Cu atoms, other than simple thermal motion, was observed. The calculated adhesion energy of Cu monolayer on the CrZr alloy monolayer is 3.75 eV and the calculated adhesion energy of CrZr monolayer on TaN(111) is 6.09 eV, significantly larger than the adhesion energy of Cu monolayer on TaN(111). The results suggest that Cu monolayer will not agglomerate on the CrZr adhesion promoting layer.

Seventh Embodiment

Cr (Chromium) Binary With Nb (Niobium) as an Adhesion Promoting Material

Ab initio molecular dynamics simulation was performed on the fully equilibrated surface with a Cu monolayer on top of a monolayer of $Cr_xNb_y$ alloy with x:y=1:1 commensurate with TaN(111) surface at 500° K.

Figure 9:
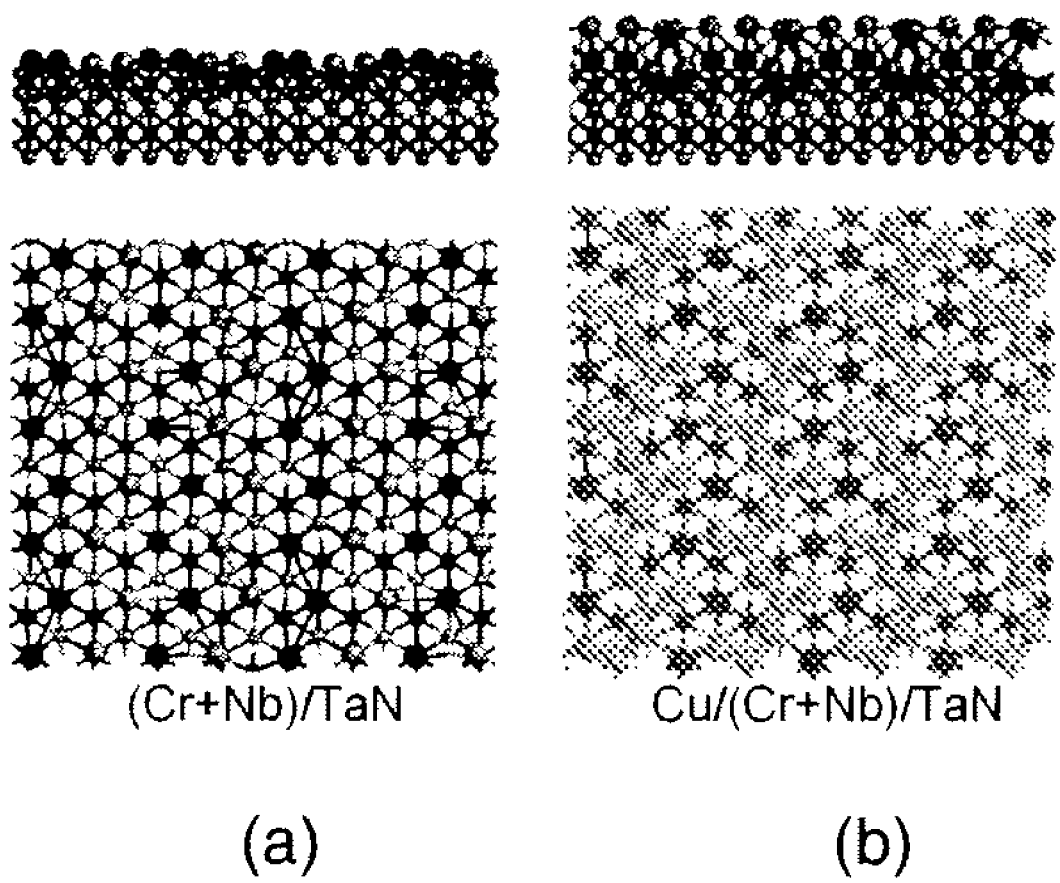
FIG. 9(a) The equilibrium structure of Chromium binary with Niobium (CrNb) adhesion promoting layer on TaN(111) surface with top view and side view.
FIG. 9(b) The equilibrium structure of Cu monolayer on the CrNb adhesion promoting layer on TaN(111) surface with top view and side view.

FIG. 9 displays equilibrated structures upon 4 ps MD simulation. FIG. 9(a) displays the equilibrium structure of CrNb adhesion promoting layer on TaN(111) surface with top view and side view. FIG. 9(b) displays the equilibrium structure of Cu monolayer on the CrNb adhesion promoting layer on TaN(111) surface with top view and side view.

No agglomeration of Cu atoms, other than simple thermal motion, was observed. The calculated adhesion energy of Cu monolayer on the CrNb alloy monolayer is 3.77 eV and the calculated adhesion energy of CrNb monolayer on TaN(111) is 5.64 eV, significantly larger than the adhesion energy of Cu monolayer on TaN(111). The results suggest that Cu monolayer will not agglomerate on the CrNb adhesion promoting.

Working Example Cr (Chromium) Containing Precursor

Synthesis of bis(2,2-dimethyl-5-(dimethylaminoethyl-imino)-3-hexanonato-N,O,N')(hydroxyl)chromium To a slushy solution of 3.45 (16.27 mmol) ligand C in 25 mL hexanes at −40° C. was added 6.51 mL (16.27 mmol) 2.5M n-BuLi in hexanes drop wise. Warmed yellow-green solution to room temperature and left to stir for 30 minutes. Evaporated off hexanes under vacuum and residual was taken up in 25 mL THF. This solution was added to a suspension of 1.00 g (8.14 mmol) CrCl2 in 10 mL THF at room temperature via canula. Heated to 60° C. for 16 hours. Evaporated off volatiles under vacuum to a dark brown oil that was taken up in hot hexanes and filtered. Isolated 2.12 g of crude product that was sublimed at 100° C. under 90 mTorr vacuum over a period of 16 hours. Needle-like crystals were grown from pentane from sublimed material. 55% crude yield.

Figure 10:
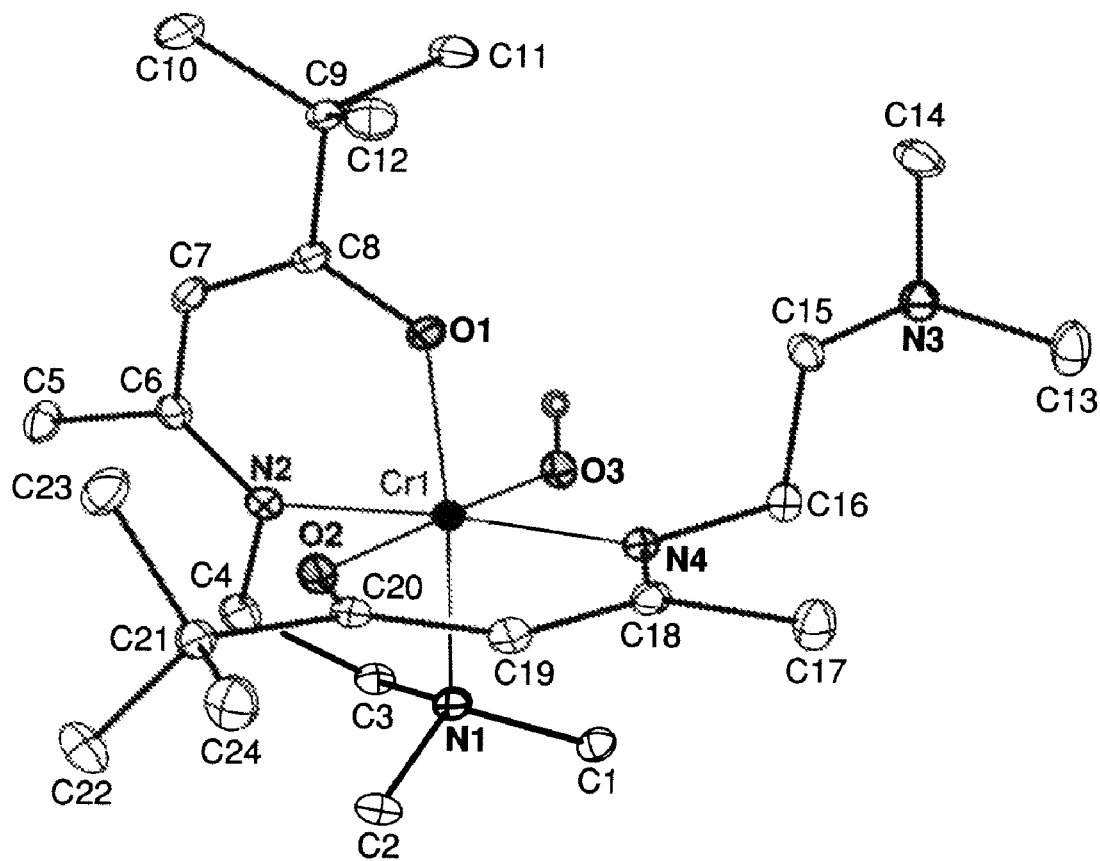
FIG. 10. Crystal structure of bis(2,2-dimethyl-5-(dimethylaminoethyl-imino)-3-hexanonato-N,O,N')(hydroxyl)chromium.

Crystal structure of bis(2,2-dimethyl-5-(dimethylaminoethyl-imino)-3-hexanonato-N,O,N')(hydroxyl)chromium is shown in FIG. 10.

In summary, several adhesion promoting layer materials based on chromium alloys have been identified to be able to significantly enhance the adhesion of copper films. Table I summarizes the adhesion energy between the barrier layer TaN(111) and the adhesion promoting layer ($\Delta E_{AB}$), and the adhesion energy between the copper seed layer and the adhesion promoting layer ($\Delta E_{CuA}$) (unit: eV).

TABLE 1

| The calculated Adhesion Energy (eV) | | | | | | | |
|---|---|---|---|---|---|---|---|
| TaN (111) | Cu | Ru | Ta | Cr | CrTi | CrNb | CrZr |
| $\Delta E_{AB}$ | 2.65 | 5.01 | 7.72 | 5.10 | 5.51 | 5.64 | 6.09 |
| $\Delta E_{CuA}$ | | 3.50 | 3.84 | 3.52 | 3.67 | 3.77 | 3.75 |

We have identified factors responsible for providing good adhesion of copper layer on various metallic surfaces and circumstances under which agglomeration of copper film occur.

To stabilize the adhesion promoting layer and prevent the agglomeration, the adhesion energy of the adhesion promoting layer on the barrier layer should be higher than the adhesion energy of copper on the barrier layer.

To stabilize the copper film and prevent the agglomeration, the adhesion energy of the copper seed layer on the adhesion promoting layer should be higher than the adhesion energy of copper on the barrier layer (otherwise, the copper seed layer would agglomerate on the glue layer);

To prevent diffusion of adhesion promoting layer atoms into the copper layer, the adhesion energy of adhesion promoting layer on the barrier layer should be higher than the adhesion energy of the copper seed layer on the glue layer.

Chromium containing complexes of a polydentate β-ketoiminate have been identified as chromium containing precursors to make the chromium alloys used for the adhesion promoting layer.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:
1. A method for controlling agglomeration and improving adhesion of a semiconductor device comprising:
  a. providing a substrate comprising at least one patterned dielectric layer and at least one barrier layer;
  b. depositing an adhesion promoting layer comprising a chromium alloy on the at least one barrier layer; and
  c. depositing a metal seed layer on the adhesion promoting layer;
    wherein adhesion energy between the adhesion promoting layer and the barrier layer is higher than adhesion energy between the adhesion promoting layer and the metal seed layer;
  wherein the chromium alloy is deposited from a chromium containing precursor having complexes of a polydentate β-ketoiminate selected from the group consisting of structure A,

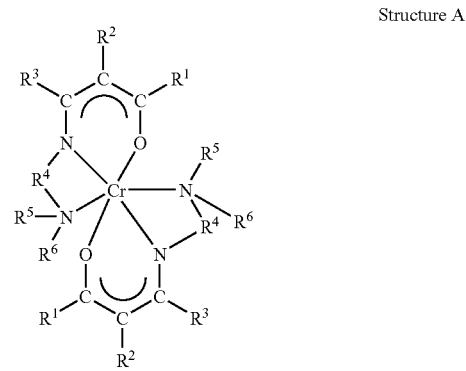

Structure A and structure B;

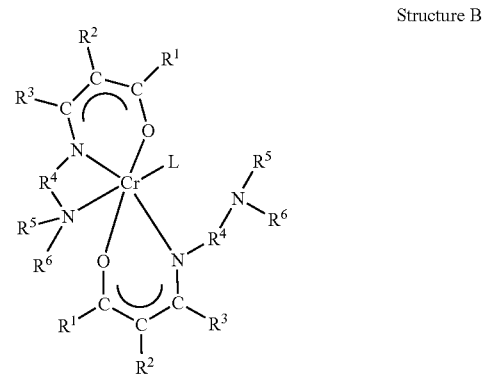

Structure B wherein: $R^1$ is a branched bulky alkyl group containing 1 to 6 carbon atoms; $R^2$ is selected from the group consisting of hydrogen, alkyl having from 1 to 6 carbon atoms, alkoxy having from 1 to 6 carbon atoms, cycloaliphatic having from 3 to 6 carbon atoms, and aryl having from 6 to 10 carbon atoms; $R^{3-4}$ are linear or branched selected from the group consisting of alkyl having from 1 to 6 carbon atoms, alkoxy having from 1 to 6 carbon atoms, cycloaliphatic having from 3 to 6 carbon atoms, and aryl having from 6 to 10 carbon atoms; $R^{5-6}$ are linear or branched, individually selected from the group consisting of linear alkyl having from 1 to 6 carbon atoms, fluoroalkyl having from 1 to 6 carbon atoms, cycloaliphatic having from 3 to 10 carbon atoms, aryl having from 6 to 10 carbon atoms, and heterocyclic containing either oxygen, or nitrogen atoms; L is monodentate donor ligand.

2. The method in claim 1, wherein the chromium alloy having a formulation of $Cr_xM_y$, wherein M is a metal selected from the group consisting of copper (Cu), silver (Ag), ruthenium (Ru), vanadium (V), tantalum (Ta), titanium (Ti), zirconium (Zr) and niobium (Nb), x is the atomic weight percentage of Cr, y is the atomic weight percentage of M, and x+y=100%.

3. The method in claim 2, wherein the chromium alloy is selected from the group consisting of chromium-copper ($Cr_x$-$Cu_y$), chromium-silver ($Cr_xAg_y$), chromium-ruthenium ($Cr_xRu_y$), chromium-vanadium ($Cr_xV_y$), chromium-tantalum ($Cr_xTa_y$), chromium-titanium ($Cr_xTi_y$), chromium-zirconium ($Cr_xZr_y$) and chromium-niobium ($Cr_xNb_y$); wherein x is in the range of 10% to 90%.

4. The method in claim 1, wherein the barrier layer comprises a material selected from the group consisting of: tantalum (Ta), tantalum-nitride (TaN), tantalum-silicon-nitride (TaSiN), titanium (Ti), titanium-nitride (TiN), and mixtures thereof.

5. The method in claim 1, wherein the metal seed layer is selected from the group consisting of a copper layer, a copper alloy layer, and combinations there of.

6. The method in claim 1, wherein the adhesion promoting layer is deposed by a process selected from the group consisting of Atomic Layer Deposition (ALD), Plasma Enhanced Atomic Layer Deposition (PEALD), Chemical Vapor Deposition (CVD), and Plasma Enhanced Chemical Vapor Deposition (PECVD), Low Pressure Chemical Vapor Deposition (LPCVD), Sub Atmospheric Chemical Vapor Deposition (SACVD), UV assisted Chemical Vapor Deposition, Filament assisted Chemical Vapor Deposition (FACVD), and Atmospheric Pressure Chemical Vapor Deposition (APCVD).

7. A method for controlling agglomeration of a copper layer and improving adhesion between a copper layer and at least one barrier layer comprising:
   (1) providing a substrate comprising the at least one barrier layer on the top of at least one patterned dielectric layer;
   (2) depositing an adhesion promoting layer comprising a chromium alloy on the at least one barrier layer, and
   (3) depositing the copper layer on the adhesion promoting layer;
   wherein adhesion energy between the adhesion promoting layer and the barrier layer is higher than adhesion energy between the adhesion promoting layer and the copper layer;
   wherein the chromium alloy is deposited from a chromium containing precursor having complexes of a polydentate β-ketoiminate selected from the group consisting of structure A,

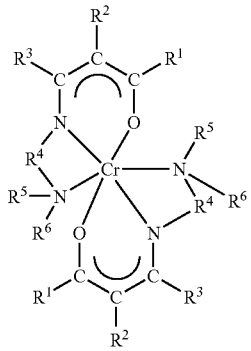

Structure A and structure B;

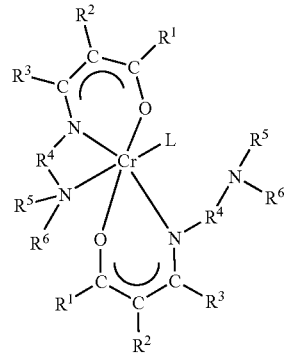

Structure B wherein: $R^1$ is a branched bulky alkyl group containing 1 to 6 carbon atoms; $R^2$ is selected from the croup consisting of hydrogen, alkyl having from 1 to 6 carbon atoms, alkoxy having from 1 to 6 carbon atoms, cycloaliphatic having from 3 to 6 carbon atoms, and aryl having from 6 to 10 carbon atoms; $R^{3-4}$ are linear or branched selected from the group consisting of alkyl having from 1 to 6 carbon atoms, alkoxy having from 1 to 6 carbon atoms, cycloaliphatic having from 3 to 6 carbon atoms, and aryl having from 6 to 10 carbon atoms; $R^{5-6}$ are linear or branched, individually selected from the group consisting of linear alkyl having from 1 to 6 carbon atoms, fluoroalkyl having from 1 to 6 carbon atoms, cycloaliphatic having from 3 to 10 carbon atoms, aryl having from 6 to 10 carbon atoms, and heterocyclic containing either oxygen, or nitrogen atoms; L is monodentate donor ligand.

8. The method in claim 7, wherein the chromium alloy having a formulation of $Cr_xM_y$, where M is a metal selected from the group consisting of copper (Cu), silver (Ag), ruthenium (Ru), vanadium (V), tantalum (Ta), titanium (Ti), zirconium (Zr) and niobium (Nb), x is the atomic weight percentage of Cr, y is the atomic weight percentage of M, and x+y=100%.

9. The method in claim 8, wherein the chromium alloy is selected from the group consisting of chromium-copper ($Cr_x$-$Cu_y$), chromium-silver ($Cr_xAg_y$), chromium-ruthenium ($Cr_xRu_y$), chromium-vanadium ($Cr_xV_y$), chromium-titanium ($Cr_xTa_y$), chromium-zirconium ($Cr_xZr_y$) and chromium-niobium ($Cr_xNb_y$); wherein x is in the range of 10% to 90%.

10. The method in claim 7, wherein the barrier layer comprises a material selected from the group consisting of: tantalum (Ta), tantalum-nitride (TaN), tantalum-silicon-nitride (TaSiN), titanium (Ti), titanium-nitride (TiN), and mixtures thereof.

11. The method in claim 7, wherein the adhesion layer is deposed by a process selected from the group consisting of Atomic Layer Deposition (ALD), Plasma Enhanced Atomic Layer Deposition (PEALD), Chemical Vapor Deposition (CVD), and Plasma Enhanced Chemical Vapor Deposition (PECVD), Low Pressure Chemical Vapor Deposition (LPCVD), Sub Atmospheric Chemical Vapor Deposition (SACVD), UV-assisted Chemical Vapor Deposition, Filament-assisted Chemical Vapor Deposition (FACVD), and Atmospheric Pressure Chemical Vapor Deposition (APCVD).

* * * * *

UNITED STATES PATENT AND TRADEMARK OFFICE
CERTIFICATE OF CORRECTION

| | | |
|---|---|---|
| PATENT NO. | : 7,919,409 B2 | Page 1 of 1 |
| APPLICATION NO. | : 12/192603 | |
| DATED | : April 5, 2011 | |
| INVENTOR(S) | : Hansong Chen et al. | |

It is certified that error appears in the above-identified patent and that said Letters Patent is hereby corrected as shown below:

Column 12

Line 22, delete "croup" and insert -- group --

Signed and Sealed this
Twenty-first Day of June, 2011

David J. Kappos
*Director of the United States Patent and Trademark Office*